United States Patent
Luo et al.

(10) Patent No.: US 8,363,710 B2
(45) Date of Patent: Jan. 29, 2013

(54) TUNABLE EQUALIZER AND METHODS FOR ADJUSTING THE TUNABLE EQUALIZER

(75) Inventors: Yan-Bin Luo, Taipei (TW); Qui-Ting Chen, Taipei County (TW)

(73) Assignee: Mediatek Inc., Hsin-Chu (TW)

( * ) Notice: Subject to any disclaimer, the term of this patent is extended or adjusted under 35 U.S.C. 154(b) by 953 days.

(21) Appl. No.: 12/426,987

(22) Filed: Apr. 21, 2009

(65) Prior Publication Data

US 2010/0111156 A1 May 6, 2010

Related U.S. Application Data

(60) Provisional application No. 61/109,551, filed on Oct. 30, 2008.

(51) Int. Cl.
*H03H 7/30* (2006.01)
(52) U.S. Cl. .................... 375/232; 375/229
(58) Field of Classification Search .............. 375/229, 375/230, 232
See application file for complete search history.

(56) References Cited

U.S. PATENT DOCUMENTS

| | | | | |
|---|---|---|---|---|
| 6,002,717 A * | 12/1999 | Gaudet | | 375/232 |
| 6,580,327 B1 * | 6/2003 | Joffe et al. | | 330/304 |
| 2005/0248394 A1 * | 11/2005 | Lou et al. | | 327/551 |
| 2009/0088106 A1 * | 4/2009 | Hwang et al. | | 455/150.1 |

OTHER PUBLICATIONS

"A 4-Channel 3.1/10.3Gb/s Transceiver Macro with a Pattern-Tolerant Adaptive Equalizer" Yasuo Hidaka et al.; ISSCC 2007/Session 24/Multi-Gb/s Transceivers/24.4; 2007 IEEE International Solid State Circuits Conference.

* cited by examiner

*Primary Examiner* — Shuwang Liu
*Assistant Examiner* — David Huang
(74) *Attorney, Agent, or Firm* — McClure, Qualey & Rodack, LLP

(57) ABSTRACT

A tunable equalizer with a tunable equalizer frequency response is provided. The tunable equalizer includes an amplifier circuit for amplifying input signals and a tunable circuit coupled to the amplifier circuit. The tunable circuit is arranged to provide a zero point in the equalizer frequency response and the zero point is adjusted according to a controllable value. When the controllable value varies according to a uniform offset, the corresponding zero point varies according to a non-uniform offset.

19 Claims, 8 Drawing Sheets

TUNABLE EQUALIZER AND METHODS FOR ADJUSTING THE TUNABLE EQUALIZER

CROSS REFERENCE TO RELATED APPLICATIONS

This application claims the benefit of U.S. Provisional Application No. 61/109,551 filed Oct. 30, 2008 and entitled "Tunable equalizer". The entire contents of which are hereby incorporated by reference.

BACKGROUND OF THE INVENTION

1. Field of the Invention

The invention relates to an equalizer, and more particularly to an equalizer capable of providing tunable zero points.

2. Description of the Related Art

As signals propagate along a communication channel, such as a transmission cable, the input signals may be attenuated due to channel loss. The phenomenon especially occurs when long transmission cables are used, wherein the input signals may be seriously distorted and therefore cause intersymbol interference (ISI). In order to compensate for channel loss, an equalizer (or a zero forcing equalizer) may be adopted at the front end of a receiver to balance the channel loss. The equalizer is designed to invert the frequency response of the channel so as to remove the effect of the channel. The equalizer usually provides a zero (or called a zero point) at its frequency response to start boosting. FIG. 1 shows an exemplary frequency response of a communication channel. As shown, the frequency response of the channel begins to drop dramatically at point 101. Thus, a zero point may be designed corresponding to the frequency at point 101 so as to provide a starting position at which the gain of the frequency response of the equalizer starts to raise.

However, because different cable lengths and different cable materials cause different channel loss, an equalizer that is capable of providing a zero point with tunable zero values for dealing with different kinds of channel conditions is highly desired.

BRIEF SUMMARY OF THE INVENTION

A tunable equalizer and methods for adjusting the tunable equalizer are provided. An embodiment of a tunable equalizer with a tunable equalizer frequency response comprises an amplifier circuit for amplifying input signals and a tunable circuit coupled to the amplifier circuit. The tunable circuit is arranged to provide a zero point in the equalizer frequency response and the zero point is adjusted according to a controllable value. When the controllable value varies according to a uniform offset, the corresponding zero point varies according to a non-uniform offset, so that the positions of the zero point are nonlinearly distributed.

An embodiment of a method for adjusting an equalizer is provided. The equalizer provides at least one zero point in a corresponding equalizer frequency response. The method comprises receiving a control signal with a controllable value; and adjusting the tunable circuit according to the controllable value, so as to provide the zero point. When the controllable value varies according to a uniform offset, the corresponding frequency of the zero point varies according to a non-uniform offset.

Another embodiment of a tunable equalizer with a tunable equalizer frequency response comprises a tunable circuit, arranged to provide a tunable zero point in the equalizer frequency response. The tunable circuit nonlinearly adjusts frequency of the zero point so that positions of the zero point are distributed nonlinearly in the frequency domain.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
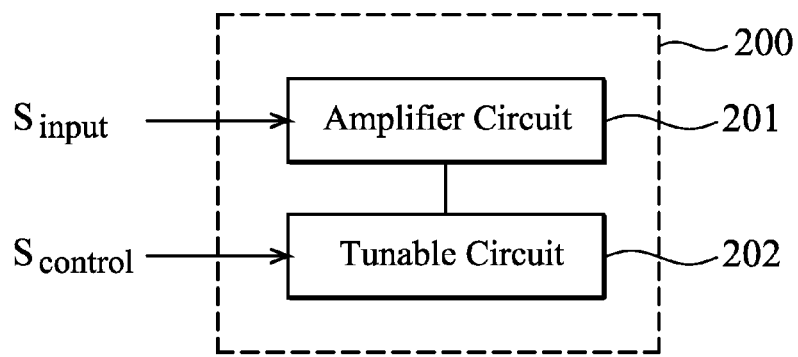
FIG. 2 is a schematic diagram illustrating a tunable equalizer according to an embodiment of the invention.

FIG. 2 is a schematic diagram illustrating a tunable equalizer according to an embodiment of the invention. The tunable equalizer 200 comprises an amplifier circuit 201 for amplifying input signal $S_{input}$ and a tunable circuit 202 coupled to the amplifier circuit 201 for adjusting corresponding frequency of the zero (or called zero point) in the frequency response of the tunable equalizer 200. The tunable circuit 202 comprises at least one resistor or device equivalent to provide resistance and at least one capacitor or device equivalent to provide capacitance. The equivalent resistance and capacitance of the tunable circuit 202 contribute an RC value, as an example, as a product of the equivalent resistance R and capacitance C, and the RC value defines a frequency of a corresponding zero point as $$f_z = \frac{1}{2\pi RC}$$

in the frequency response of the tunable equalizer 200. The tunable circuit 202 receives a control signal $S_{Control}$ with a controllable value ISI_Control, and accordingly adjusts the resistance of the resistor (or device equivalent to provide resistance) and/or capacitance of the capacitor (or device equivalent to provide capacitance) so as to adjust the corresponding RC value. According to an embodiment of the invention, the controllable value ISI_Control is a value indicating the extent of channel loss of a communication channel that the input signal $S_{input}$ propagated through and may be determined according to a feedback of a channel estimation device or an ISI monitor device (not shown). As the RC value changes with the controllable value ISI_Control, the frequency response of the tunable equalizer 200 changes accordingly. Thus, the tunable circuit 202 is with a tunable frequency response and is capable of providing zero point with tunable values.

Figure 3:
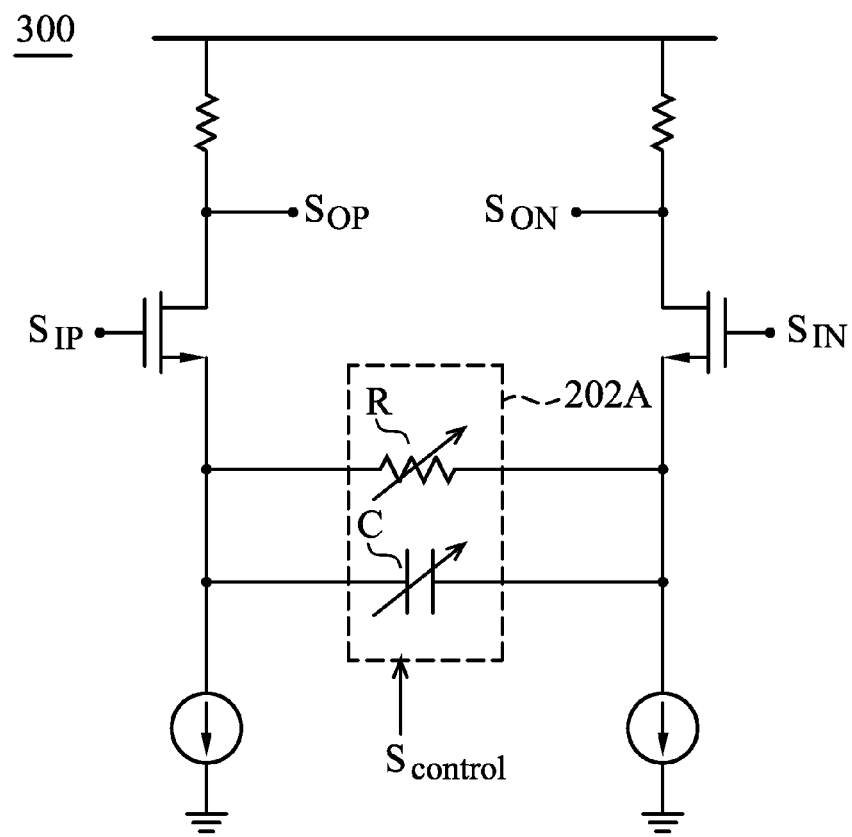
FIG. 3 shows a circuit diagram of a tunable equalizer according to an embodiment of the invention.
Figure 4:
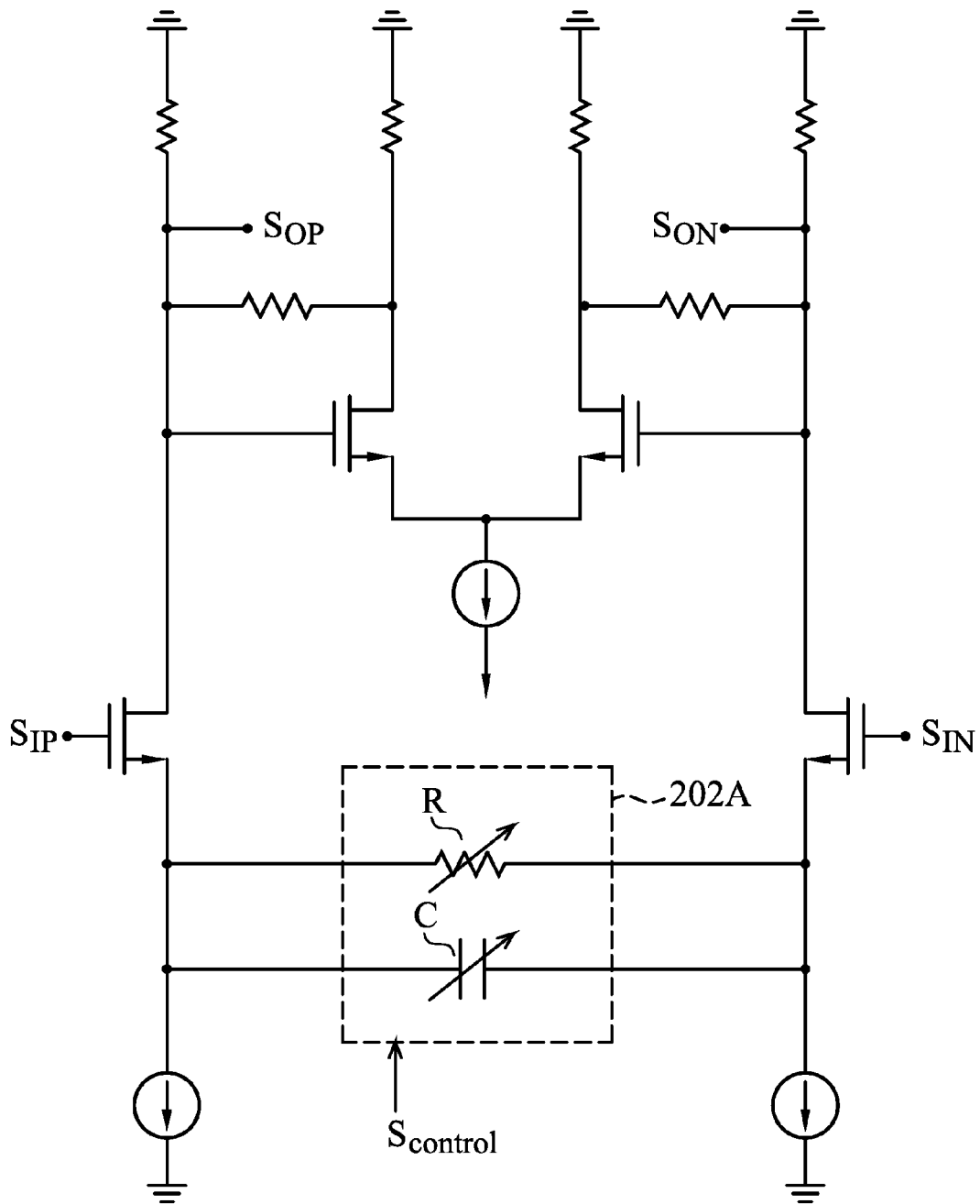
FIG. 4 shows a circuit diagram of a tunable equalizer according to another embodiment of the invention.
Figure 5:
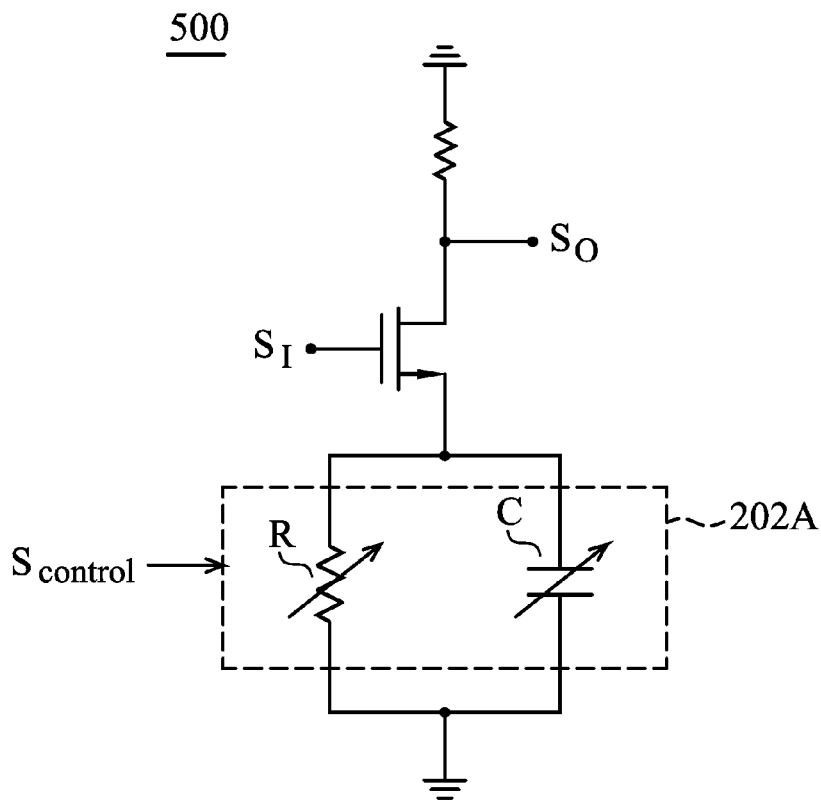
FIG. 5 shows a circuit diagram of a tunable equalizer according to another embodiment of the invention.
Figure 6:
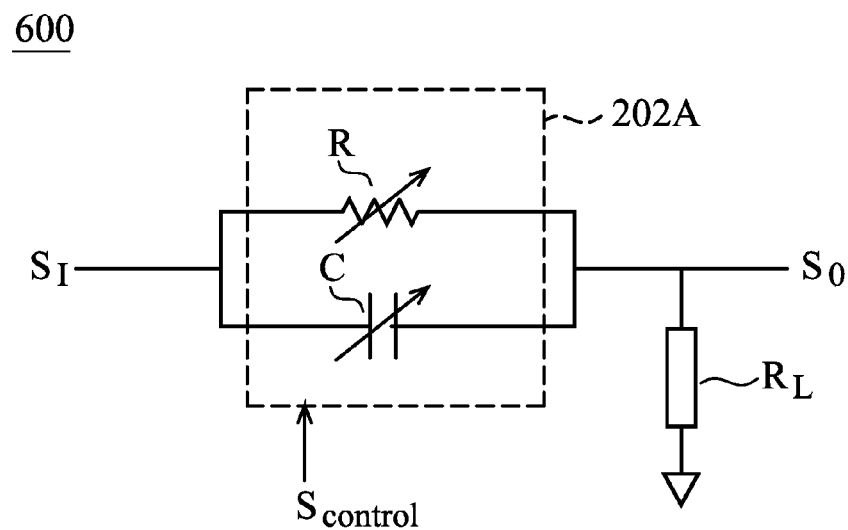
FIG. 6 shows a circuit diagram of a tunable equalizer according to another embodiment of the invention.

FIG. 3 shows a circuit diagram of a tunable equalizer according to an embodiment of the invention. As shown in FIG. 3, the tunable equalizer 300 comprises a tunable circuit 202A and a differential amplifier (the remaining portion). The differential amplifier receives differential input signals $S_{IN}$ and $S_{IP}$, amplifies the input signals, and outputs the differential output signals $S_{ON}$ and $S_{OP}$. It should be noted that the structure of the amplifier circuit should not be limited to the one as shown in FIG. 3. As one of ordinary skill in the art will readily appreciate, the tunable equalizer may comprise any type of amplifier performing substantially the same function or achieving substantially the same result. As an example, FIG. 4 shows a circuit diagram, with another differential amplifier design, of a tunable equalizer 400 according to another embodiment of the invention. Further, FIG. 5 shows a circuit diagram, with another single end amplifier design, of a tunable equalizer 500 according to another embodiment of the invention. It should be noted that according to yet another embodiment of the invention, the tunable equalizer may also be implemented without an amplifier. FIG. 6 shows a circuit diagram of a tunable equalizer 600 according to another embodiment of the invention. The $R_L$ may be a network to divide the voltage at the output for stabilizing the DC value of the output signals $S_O$, or to filter the output signals $S_O$. Thus, as one of ordinary skill in the art will readily appreciate from the disclosure of the invention, an equalizer circuit that performs substantially the same functions or achieves substantially the same results as the corresponding embodiments described herein may be utilized according to the invention.

Figure 1:
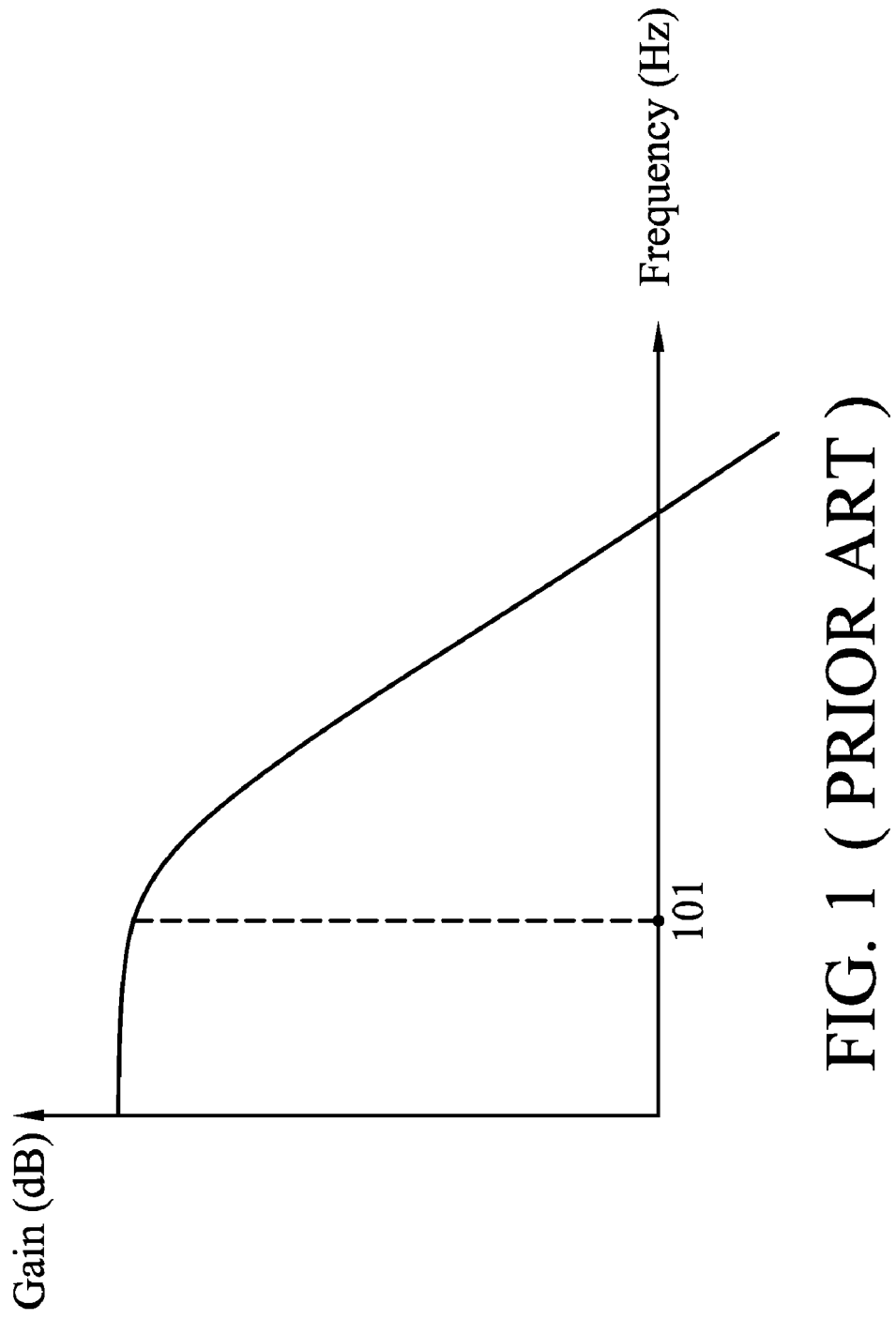
FIG. 1 shows an exemplary frequency response of a communication channel.

As shown in FIG. 3, FIG. 4, FIG. 5 and/or FIG. 6, the tunable circuit 202A comprises a variable resistor and a variable capacitor that are coupled in parallel and may be individually or simultaneously adjusted according to the controllable value ISI_Control of the control signal $S_{Control}$. According to an embodiment of the invention, when the controllable value ISI_Control varies according to a uniform offset, the corresponding RC value varies according to a non-uniform offset. As an example, when the controllable value ISI_Control increases according to the uniform offset (for example, ISI_Control=1, 2, 3 . . . ), the corresponding RC value increases according to an incremental offset (for example, RC value=2, 4, 8 . . . ). As another example, since the corresponding frequency of the zero point is defined by a reciprocal of the RC value, when the controllable value increases according to the uniform offset, the corresponding frequency of the provided zero point decreases according to a decreasing offset. The reason to adjust the RC value non-uniformly is to make the frequencies of the zero point correspond to different RC values that are obtained according to the different controllable values to be distributed non-uniformly in the frequency domain. Please refer back to FIG. 1, as well known by one of ordinary skill in the art, when the channel condition becomes worse, i.e., the channel loss becomes more serious, the gain drops more quickly. That is, the corresponding frequency of the point 101, that the gain begins to drop, decreases as the channel loss increases. Thus, it is preferable to provide tunable zeros with finer resolution in the lower frequency area so as to increase the boosted gain resolution of the equalization in the higher frequency area. Thus, more different channel loss could be compensated by the equalizer. According to the embodiment of the invention, the controllable value ISI_Control may be adjusted according to corresponding channel loss of a channel frequency response of a communication channel, such as a wired communication channel (for example, a cable), that the input signals propagated through, and the zero points are distributed denser in a frequency band having relative large channel loss of the channel frequency response than in that having a relative small channel loss. The channel frequency response may be estimated by a channel estimation device (not shown) of a receiver (not shown) comprising the tunable equalizer (e.g. 200, 300, 400, 500 or 600) and as previously described, the control signal $S_{Control}$ is generated according to the estimated channel frequency response and fed back to the tunable equalizer. The adjustable zero points provided by the tunable equalizer may have finer resolution in the relative low frequency band (or the frequency band with relative large channel loss that should be mainly concerned), than in the relative high frequency band (or the frequency band with relative small channel loss).

According to another embodiment of the invention, the RC value and the corresponding frequency of the zero point may also be adjusted exponentially according to the controllable value ISI_Control. As an example, the controllable value ISI_Control may be assigned as an exponent of a base RC value ($V_{RCB}$) and the RC value ($V_{RC}$) may be adjusted according to an arithmetic result of the controllable value and the base RC value. As an example, the RC value ($V_{RC}$) may be adjusted proportional to the following equation:

$$V_{RCB}^{ISI\_Control} \qquad \text{Eq. 1}$$

so that the zero points corresponding to the RC values that are obtained according to different controllable values may be distributed exponentially in the frequency domain. According to another embodiment of the invention, the capacitor in the tunable circuit may be adjusted substantially according to the following equation:

$$C = C_b \cdot C_r^{ISI\_Control} \qquad \text{Eq. 2}$$

where C represents the capacitance of the capacitor, $C_b$ represents a constant capacitance and $C_r$ represents a base capacitance. Similarly, the resistor in the tunable circuit may be adjusted substantially according to the following equation:

$$R = R_b \cdot R_r^{ISI\_Control} \qquad \text{Eq. 3}$$

where R represents the resistance of the resistor, $R_b$ represents a constant resistance, and $R_r$ represents a base resistance. It should be noted that according to yet another embodiment of the invention, a table comprising information indicating the controllable value ISI_Control and the corresponding RC values of the capacitor and resistor may also be provided in advance. When the channel loss is estimated, the corresponding resistance of the resistor and/or the corresponding capacitance of the capacitor may be obtained according to the table. Please note that, in this embodiment, the controllable values ISI_Control in the lookup table is not necessary to have uniform offsets (for example, controllable values could be 1, 2.5, 3 . . . ). As long as the corresponding RC value obtained by the table makes the zero point distribute nonlinearly (or exponentially) in the frequency domain, a substantially same effect can be obtained.

As previously described, the capacitance of the capacitor and the resistance of the resistor may also be adjusted simultaneously in a similar manner and the invention should not be limited thereto. In another embodiment, the tunable circuit 202A may comprise a variable resistor and a constant capacitor, or comprise a constant resistor and a variable capacitor, which are coupled in parallel. The variable resistor or variable capacitor is adjusted according to the controllable value ISI_Control of the control signal $S_{Control}$ while the resistance of the constant resistor or capacitance of the constant capacitor is fixed. It should also be noted that since the effective capacitance and/or resistance may be deviated, or the capacitance and/or the resistance obtained according to Eq. 1, Eq. 2, Eq. 3 or by looking up the table may be rounded up or down according to the circuit design, as one of ordinary skill in the art will readily appreciate from the disclosure of the invention, a circuit that performs substantially the same function or achieves substantially the same result as the corresponding embodiments described herein may be utilized according to the invention. Various changes, substitutions and alterations can be made herein without departing from the spirit and scope of the invention as defined by the appended claims.

Figure 7:
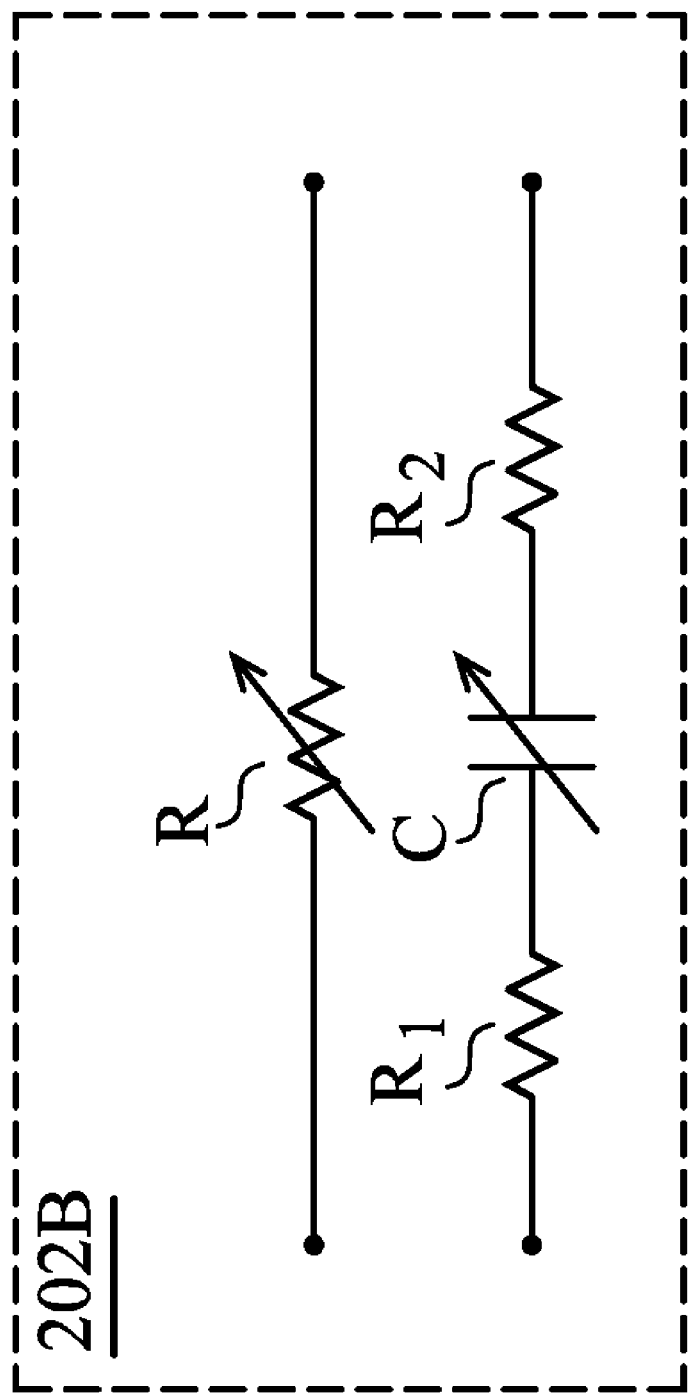
FIG. 7 shows another tunable circuit according to another embodiment of the invention.

As well known in the art, the zero point of an equalizer may also be designed via different circuit structures. FIG. 7 shows another tunable circuit 202B according to another embodiment of the invention. As shown, the tunable circuit may further comprise resistors $R_1$ and $R_2$ coupled to the capacitor in serial. According to another embodiment of the invention, the resistors $R_1$ and $R_2$ may also be replaced by a device equivalent to provide resistance, such as a MOS transistor, and the invention should not be limited thereto. Thus, as one of ordinary skill in the art will readily appreciate from the disclosure of the invention, a circuit that perform substantially the same functions or achieves substantially the same results as the corresponding embodiments described herein may be utilized according to the invention. Various changes, substitutions and alterations can be made herein without departing from the spirit and scope of the invention as defined by the appended claims.

Figure 8:
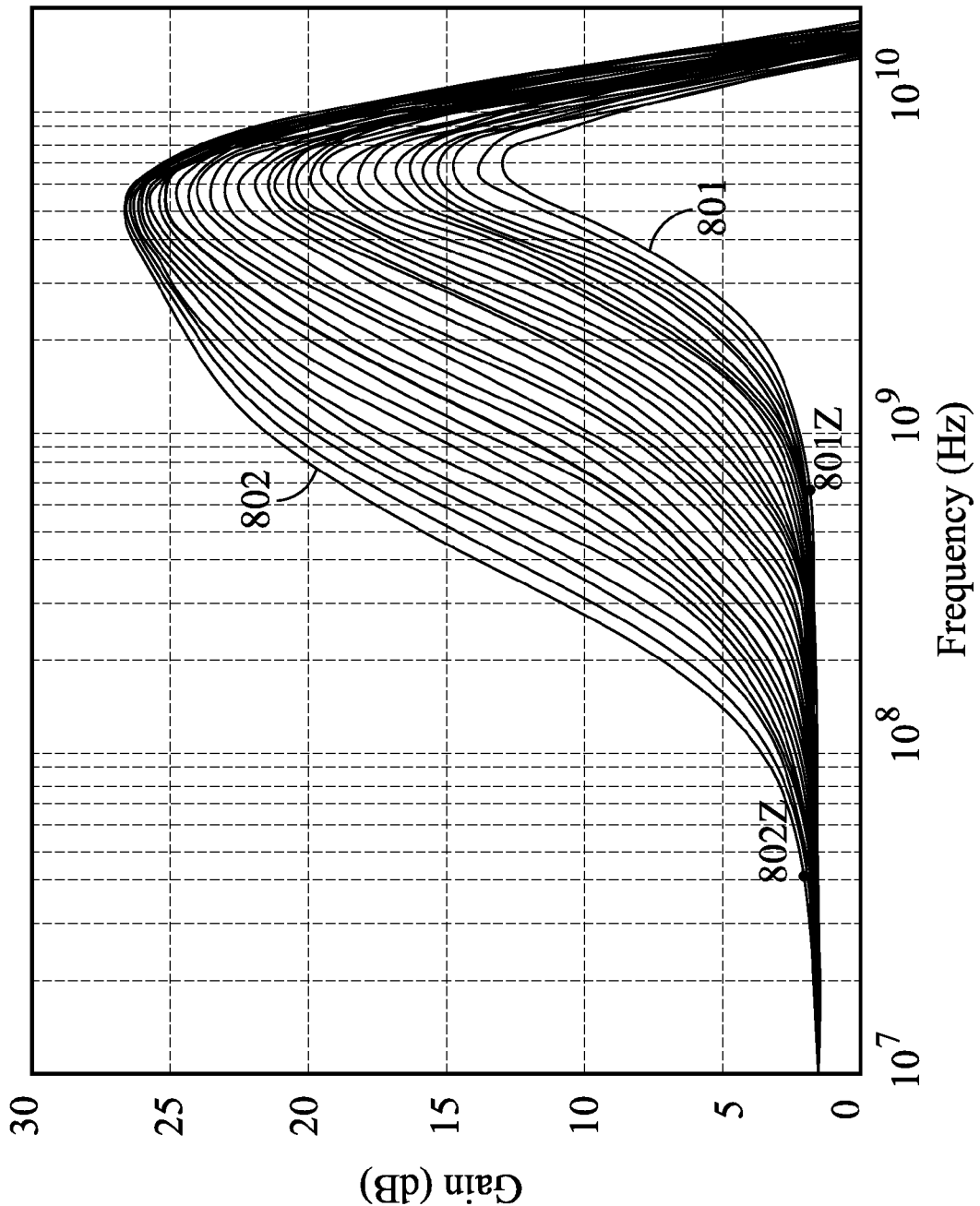
FIG. 8 shows multiple frequency responses of the tunable equalizer obtained according to different adjusted capacitances according to the controllable value according to an embodiment of the invention.
Figure 9:
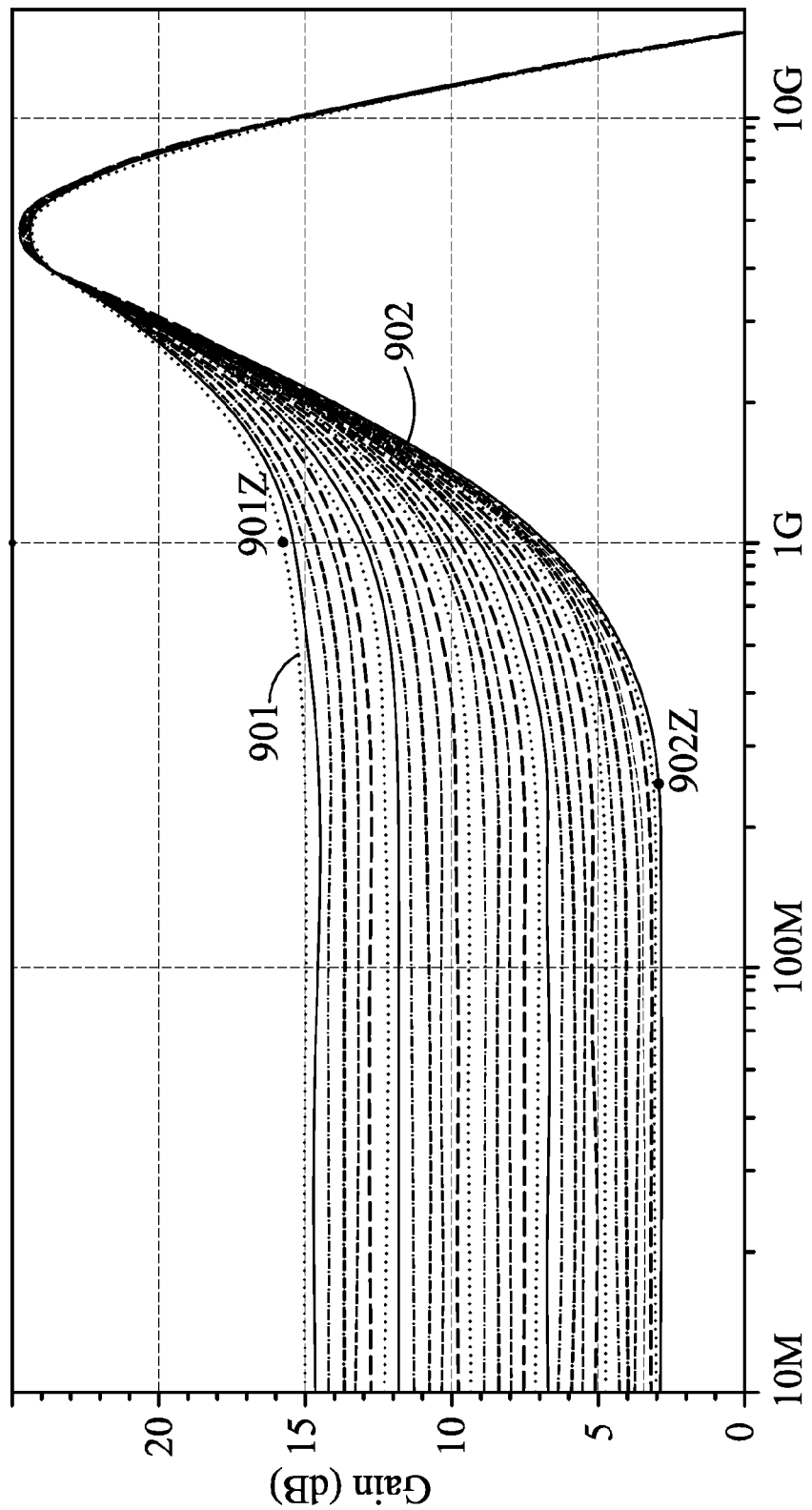
FIG. 9 shows multiple frequency responses of the tunable equalizer obtained according to different adjusted resistances according to the controllable value according to an embodiment of the invention.

FIG. 8 shows multiple frequency responses of the tunable equalizer obtained according to different adjusted capacitances according to the controllable value according to an embodiment of the invention. Line 801 represents a corresponding frequency response obtained according to a first controllable value and line 802 represents a corresponding frequency response obtained according to a second controllable value greater than the first controllable value. As the controllable value increases, which means the channel condition is worse and the channel loss increases, the corresponding frequency of the provided zero point moves toward the lower frequency band. It is to be noted that the frequency axis is drawn in the log scale. Therefore, when the frequency responses are represented in a normal scale, the corresponding zero points (such as zero points $801z$ and $802z$) are distributed denser in a relative low frequency band and thus the tunable equalizer provides tunable zero points with finer resolution in a relative low frequency band. FIG. 9 shows multiple frequency responses of the tunable equalizer obtained according to different adjusted resistances according to the controllable value according to an embodiment of the invention. Line 901 represents a corresponding frequency response obtained according to a third controllable value and line 902 represents a corresponding frequency response obtained according to a fourth controllable value greater than the third controllable value. As the controllable value increases, which means the channel condition is worse and the channel loss increases, the corresponding frequency of the provided zero point moves toward the lower frequency band. It is to be noted that the frequency axis is drawn in the log scale. Therefore, when the frequency responses are represented in a normal scale, the corresponding zero points (such as zero points $901z$ and $902z$) are distributed denser in a relative low frequency band and thus the tunable equalizer provides tunable zero points with finer resolution in a relative low frequency band.

Figure 10:
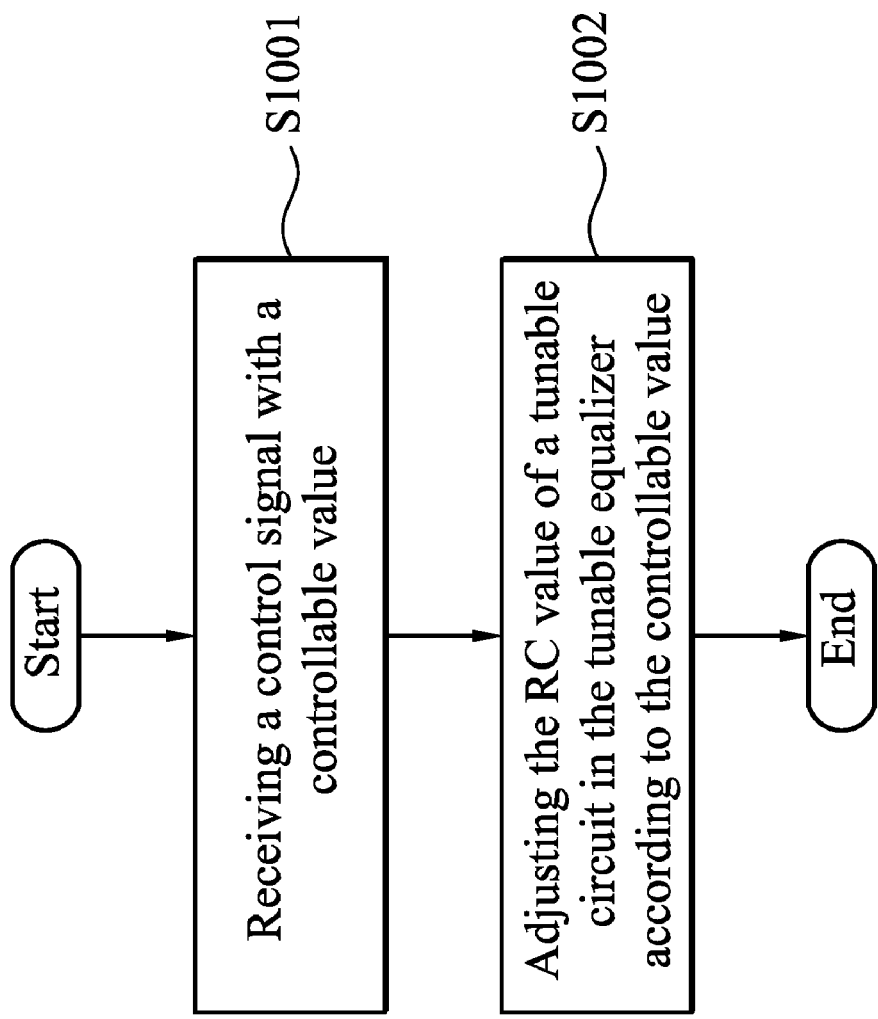
FIG. 10 is a flow chart illustrating a method for adjusting the equalizer according to an embodiment of the invention.

FIG. 10 is a flow chart illustrating a method for adjusting the tunable equalizer according to an embodiment of the invention. Firstly, a control signal with a controllable value is received (Step S1001). The controllable value may vary according to channel loss of a channel frequency response of a communication channel that the input signals propagated through. Next, the RC value of a tunable circuit in the tunable equalizer is adjusted according to the controllable value (Step S1002). As previously described, the RC value is contributed by resistance of at least one resistor and capacitance of at least one capacitor comprised in the tunable circuit so as to provide the zero point. When the controllable value varies according to a uniform offset, the corresponding frequency of the zero point varies according to a non-uniform offset.

According to the embodiment of the invention, the zero points provided by the tunable equalizer (e.g. 200, 300, 400, 500 or 600) would be distributed non-linearly in the frequency domain. As an example, for the frequency band with relative large channel loss that should be mainly concerned, the resolution of the provided zeros could be finer by the tunable equalizer design so as to provide more tunable zeros. One of the implementation as previously described is to exponentially provide the zeros. In addition, according to the embodiment of the invention, the proposed tunable equalizer is preferably used in wire line transmission, such as the chip-to-chip transmission on the Printed Circuit Board (PCB), a High-Definition Multimedia Interface (HDMI), a Serial Advanced Technology Attachment (SATA) interface, a Universal Serial Bus (USB) interface. Since the configurations of the capacitor(s) and resistor(s) of the tunable equalizer are optimized, the area could be greatly reduced and the resolution of the provided zeros is greatly increased. Further, the performance of channel compensation is also improved.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A tunable equalizer with a tunable equalizer frequency response, comprising:
    an amplifier circuit for amplifying input signals; and
    a tunable circuit coupled to the amplifier circuit and arranged to provide a zero point in the equalizer frequency response, wherein the zero point is adjusted according to a controllable value, and when the controllable value varies according to a uniform offset, the corresponding zero point varies according to a non-uniform offset;
    wherein the controllable value is adjusted according to corresponding channel loss of a communication channel that the input signals propagated through, and wherein the zero points are distributed denser in a frequency band with relative large channel loss of the communication channel than in a frequency band with a relative small channel loss of the communication channel.

2. The tunable equalizer as claimed in claim 1, wherein when the controllable value increases according to the uniform offset, the corresponding frequency of the provided zero point decreases according to a decreasing offset.

3. The tunable equalizer as claimed in claim 1, wherein the zero points corresponding to different controllable values are distributed non-uniformly in the frequency domain.

4. The tunable equalizer as claimed in claim 1, wherein the zero points are distributed denser in a relative low frequency band than in a relative high frequency band.

5. The tunable equalizer as claimed in claim 1, wherein the zero points corresponding to different controllable values are distributed exponentially in the frequency domain.

6. The tunable equalizer as claimed in claim 1, wherein the tunable circuit comprises a first resistor and a capacitor that provide the zero point, the first resistor and the capacitor have an RC value representing a product of a resistance of the first resistor and a capacitance of the capacitor, and when the controllable value increases according to the uniform offset, the corresponding RC value increases according to an incremental offset.

7. The tunable equalizer as claimed in claim 6, wherein the tunable circuit further comprises a second resistor coupled to the capacitor in serial.

8. The tunable equalizer as claimed in claim 1, wherein the tunable circuit comprises a capacitor for providing the zero point, and a capacitance of the capacitor is adjusted according to the following equation:

$$C = C_b \cdot C_r^{ISI\_Control}$$

where C represents the capacitance, $C_b$ represents a constant capacitance, $C_r$ represents a unit-less base capacitance value, and ISI_Control represents the controllable value.

9. The tunable equalizer as claimed in claim 1, wherein the tunable circuit comprises a resistor for providing the zero point, and a resistance of the resistor is adjusted according to the following equation:

$$R = R_b \cdot R_r^{ISI\_Control}$$

where R represents the resistance, $R_b$ represents a constant resistance, $R_r$ represents a unit-less base resistance value, and ISI_Control represents the controllable value.

10. The tunable equalizer as claimed in claim 1, wherein the zero point is adjusted according to the controllable value by using a lookup table comprising information indicating a series of controllable values and corresponding zero points.

11. A method for adjusting an equalizer providing at least one zero point in a corresponding equalizer frequency response, the method comprising:
receiving a control signal with a controllable value; and
adjusting the zero point of the equalizer according to the controllable value, wherein when the controllable value varies according to a uniform offset, the corresponding frequency of the zero point varies according to a non-uniform offset;
wherein the zero points corresponding to different controllable values are distributed denser in a frequency band with relative large channel loss of the communication channel than in a frequency band with a relative small channel loss of the communication channel.

12. The method as claimed in claim 11, wherein the adjusting step comprises when the controllable value increases according to the uniform offset, decreasing the corresponding frequency of the provided zero point according to a decreasing offset.

13. The method as claimed in claim 11, wherein the zero points corresponding to different controllable values are distributed denser in a relative low frequency band than in a relative high frequency band.

14. The method as claimed in claim 11, wherein the controllable value corresponds to channel loss of a communication channel that input signals of the equalizer propagated through.

15. The method as claimed in claim 11, wherein the zero points corresponding to different controllable values are distributed exponentially in the frequency domain.

16. The method as claimed in claim 11, wherein the equalizer comprises a resistor and a capacitor that provide the zero point, the resistor and the capacitor have an RC value representing a product of a resistance of the resistor and a capacitance of the capacitor, and the method further comprises:
assigning the controllable value as an exponent of a base RC value;
and the adjusting step comprises adjusting the RC value according to an arithmetic result of the controllable value and the base RC value.

17. The method as claimed in claim 11, wherein the equalizer comprises a capacitor for providing the zero point, and the adjusting step comprises adjusting a capacitance of the capacitor according to the following equation:

$$C = C_b \cdot C_r^{ISI\_Control}$$

where C represents the capacitance, $C_b$ represents a constant capacitance, $C_r$ represents a unit-less base capacitance value, and ISI_Control represents the controllable value.

18. The method as claimed in claim 11, wherein the equalizer comprises a resistor for providing the zero point, and the adjusting step comprises adjusting a resistance of the resistor according to the following equation:

$$R = R_b \cdot R_r^{ISI\_Control}$$

where R represents the resistance, $R_b$ represents a constant resistance, $R_r$ represents a unit-less base resistance value, and ISI_Control represents the controllable value.

19. The method as claimed in claim 11, wherein the adjusting step comprises adjusting the zero point according to the controllable value by using a lookup table comprising information indicating a series of controllable values and corresponding zero points.

* * * * *